United States Patent
Okada et al.

(10) Patent No.: US 7,366,481 B2
(45) Date of Patent: Apr. 29, 2008

(54) APPARATUS FOR RADIO TELECOMMUNICATION SYSTEM AND METHOD OF BUILDING UP OUTPUT POWER

(75) Inventors: Kazuhisa Okada, Kiryu (JP); Kazuhiko Hikasa, Hamura (JP); Patrick Wurm, Cambridge (GB)

(73) Assignees: Renesas Technology Corporation, Tokyo (JP); Tipcom Limited, Royston, Hertfordshire (GB)

( * ) Notice: Subject to any disclaimer, the term of this patent is extended or adjusted under 35 U.S.C. 154(b) by 0 days.

(21) Appl. No.: 11/730,585

(22) Filed: Apr. 3, 2007

(65) Prior Publication Data

US 2007/0238424 A1    Oct. 11, 2007

Related U.S. Application Data

(63) Continuation of application No. 10/372,919, filed on Feb. 26, 2003, now Pat. No. 7,209,717.

(30) Foreign Application Priority Data

May 31, 2002    (GB) .................................. 0212737.1

(51) Int. Cl.
H01Q 11/12    (2006.01)
H04B 1/04    (2006.01)
(52) U.S. Cl. .................................. 455/126; 455/127.2
(58) Field of Classification Search ................ 455/126, 455/127.2, 127.1, 102, 108, 110; 375/300, 375/302; 332/145, 149, 144
See application file for complete search history.

(56) References Cited

U.S. PATENT DOCUMENTS 4,571,549 A    2/1986    Lods et al.
5,091,706 A    2/1992    Lautzenhiser
5,101,506 A    3/1992    Walls
5,430,416 A    7/1995    Black
5,802,450 A    9/1998    Horton
5,910,753 A    6/1999    Bogdan
6,018,275 A    1/2000    Perrett et al.
6,043,707 A    3/2000    Budnik
6,147,553 A    11/2000    Kolanek
6,215,362 B1    4/2001    Feng et al.

(Continued)

FOREIGN PATENT DOCUMENTS

DE    10056472    11/2000
EP    339605    11/1989
EP    457749    11/1991
EP    0535669    1/1992
EP    731556    9/1996

(Continued)

OTHER PUBLICATIONS

"High Linearity RF Amplifier Design", Artech House, 1979, P. Kenington, p. 162.

Primary Examiner—Nguyen T. Vo
(74) Attorney, Agent, or Firm—Mattingly, Stanger, Malur & Brundidge, PC

(57) ABSTRACT

A polar loop based radio telecommunication apparatus which has a phase control loop for controlling the phase of a carrier outputted from an oscillator for transmitter, and an amplitude control loop for controlling the amplitude of a transmission output signal outputted from a power amplifier circuit, wherein precharge means is provided on a forward path from a current source, through the power amplifier circuit, to a detection circuit, forming the amplitude control loop, for rapidly increasing a control voltage for the power amplifier circuit to a power threshold upon starting transmission.

4 Claims, 9 Drawing Sheets

U.S. PATENT DOCUMENTS

| | | |
|---|---|---|
| 6,633,199 B2 | 10/2003 | Nielsen et al. |
| 6,792,282 B1 | 9/2004 | Domino et al. |
| 6,924,711 B2 | 8/2005 | Liu |
| 6,952,567 B2 | 10/2005 | Sowlati |
| 7,209,717 B2 * | 4/2007 | Okada et al. ............... 455/126 |
| 2002/0080716 A1 | 6/2002 | Asam et al. |
| 2002/0140511 A1 | 10/2002 | Myers et al. |
| 2003/0109240 A1 | 6/2003 | Zipper |
| 2003/0223510 A1 | 12/2003 | Kurakami et al. |
| 2003/0224740 A1 | 12/2003 | Takano et al. |
| 2004/0198257 A1 | 10/2004 | Takano et al. |
| 2005/0064828 A1 | 3/2005 | Kurakami et al. |

FOREIGN PATENT DOCUMENTS

| | | |
|---|---|---|
| EP | 786864 | 7/1997 |
| EP | 788236 | 8/1997 |
| EP | 797298 | 9/1997 |
| EP | 1115205 | 7/2001 |
| EP | 1211801 A3 | 10/2003 |
| GB | 2237157 | 4/1991 |
| GB | 2291754 A | 1/1996 |
| GB | 2369941 | 6/2002 |
| JP | 3-209994 | 9/1991 |
| JP | 4-372246 | 12/1992 |
| JP | 11-355139 | 12/1999 |
| JP | 2000-244341 | 9/2000 |
| SU | 756603 | 8/1980 |
| WO | 01/41296 | 6/2001 |
| WO | 02/37666 | 5/2002 |

\* cited by examiner

APPARATUS FOR RADIO TELECOMMUNICATION SYSTEM AND METHOD OF BUILDING UP OUTPUT POWER

This is a continuation application of U.S. Ser. No. 10/372,919, filed Feb. 26, 2003 now U.S. Pat. No. 7,209,717, the content of which is hereby incorporated by reference into this application.

CROSS-REFERENCE TO RELATED APPLICATION

The present application relates to subject matters described in the U.S. patent applications being file based on the United Kingdom Patent Applications No. 0212725.6 filed on May 31, 2002, No. 0212729.8 filed on May 21, 2002, No. 0212723.1 filed on May 21, 2002, No. 0212735.5 filed on May 31, 2002, and No. 0212732.2 filed on May 31, 2002. All of those U.S. applications are assigned to the same assignees of the present application.

BACKGROUND OF THE INVENTION

The present invention relates to techniques for improving the controllability of output power by a power control signal of a high frequency power amplifier circuit and for building up without fail the output power of the high frequency power amplifier circuit upon starting, and more particularly, to techniques suitable for application in a semiconductor integrated circuit for communication which contains a phase detection circuit and an amplitude detection circuit, and an apparatus for radio telecommunication system such as a portable telephone which incorporates the semiconductor integrated circuit for communication.

One of conventional schemes for radio telecommunication apparatus (mobile telecommunication apparatus) such as a portable telephone is GSM (Global System for Mobile Communication) which is employed in Europe. This GSM scheme uses a phase modulation mode called GMSK (Gaussian Minimum Shift Keying) which shifts the phase of a carrier in accordance with transmission data.

Generally, a high frequency power amplifier circuit is incorporated in a transmission output unit in a radio telecommunication apparatus. A conventional GSM-based radio telecommunication apparatus employs a configuration for controlling a bias voltage of a high frequency power amplifier circuit to provide output power required for a call by means of a control voltage outputted from a circuit, called an APC (Automatic Power Control) circuit, which generates a control signal for a transmission output based on a signal from a detector for detecting a transmission output and a level required for transmission from a baseband LSI.

In recent portable telephones, an EDGE (Enhanced Data Rates for GMS Evolution) scheme has been proposed. The EDGE scheme has dual-mode communication functions, and relies on GMSK modulation to perform audio signal communications and on $3\pi/8$ rotating 8-PSK (Phase Shift Keying) modulation to perform data communication. The 8-PSK modulation is such modulation that adds an extra amplitude shift to a phase shift of a carrier in the GMSK modulation. Since the 8-PSK modulation can send 3-bit information per symbol, in contrast with the GMSK modulation which sends 1-bit information per symbol, the EDGE scheme can achieve communications at a higher transmission rate as compared with the GSM scheme.

As one implementation of a modulation mode for imparting information on a phase component and an amplitude component, respectively, of a transmission signal, there is a conventionally known method called "polar loop" which involves separating a signal intended for transmission into a phase component and an amplitude component, subsequently applying feedback to the separated components through a phase control loop and an amplitude control loop, and combining the resulting components by an amplifier for outputting the combined components (for example, "High Linearity RF Amplifier Design" by Kenington, Peter B., p 162, published by ARTECH HOUSE, INC. in 1979).

A GSM-based communication system is only required to output a phase modulated signal in accordance with a required output level, so that a high frequency power amplifier circuit at a final stage can be operated in a saturation region, whereas a radio communication system capable of EDGE-based transmission/reception must perform an amplitude control, so that a high frequency power amplifier circuit at a final stage must be linearly operated in a non-saturation region. However, with a method of driving a high frequency power amplifier circuit used in a conventional GSM-based communication system, it is difficult to ensure the linearity which is required by the high frequency power amplifier circuit in a small output level region. On the other hand, the polar loop configuration can advantageously satisfy the requirement for the linearity of the high frequency power amplifier circuit, and improve the power efficiency in the low output level region.

SUMMARY OF THE INVENTION

In this regard, the present inventors considered the employment of the polar loop configuration in an EDGE-based radio communication system. As a result, while a prescription is given for portable telephone terminals supporting EDGE or GSM to increase output power OUT of an output power amplifier to a power threshold within a fixed time upon starting transmission, it was found that the polar loop configuration suffers from a long time taken until an amplitude control loop is stabilized upon building up the output power, and resulting difficulties in building up the output power within the prescribed time.

Further, an investigation on the cause of the problems revealed that the amplitude control loop is instable due to a small phase margin and a narrow frequency bandwidth thereof because currently provided output power amplifiers do not ensure their operations in a region in which an output control voltage is very small.

More specifically, among characteristics required for an output power amplifier, the control voltage—power characteristic is desired to linearly increase output power POUT with respect to an output control voltage VRAMP, as indicated by a solid line A in FIG. 10. In addition, the output power—gain characteristic is desired to provide a constant gain GPA of the amplifier with respect to the output power OUT, as indicated by a solid line AA in FIG. 11. However, an actual output power amplifier exhibits the control voltage—power characteristic, as indicated by a broken line B in FIG. 10, in which the output power POUT does not linearly change within a range in which the output control voltage VRAMP is small, and the output power—gain characteristic, as indicated by a broken line BB in FIG. 11, in which the gain is lower than a desired level in the range in which the output control voltage VRAMP is small. As a result, it becomes apparent that if an attempt is made to build up the output power of the output power amplifier while the amplitude control loop is left closed, a long time is taken until the amplitude control loop is stabilized, thus making it difficult to build up the output power within a prescribed time.

It is an object of the present invention to provide a highly reliable apparatus for radio telecommunication system, such as a portable telephone that has a function of performing phase modulation and amplitude modulation, which is capable of preventing a long delay in stabilizing an amplitude control loop due to a reduction in closed loop frequency bandwidth caused by a change in the open loop gain. An additional drawback is the reduction of phase margin caused by the reduction of open loop gain that may reduce the stability of the amplitude loop.

It is another object of the present invention to provide a highly reliable apparatus for a radio telecommunication system, such as a portable telephone that has a function of performing phase modulation and amplitude modulation, which is capable of increasing the output power of an output power amplifier to a power threshold without fail within a prescribed time upon starting transmission.

It is another object of the present invention to provide a highly reliable apparatus for a radio telecommunication system which is capable of increasing the output power of an output power amplifier to a power threshold without fail within a prescribed time upon starting transmission under all conditions of operations.

The aforementioned and other objects and novel features of the present invention will become apparent from the description of the specification and the accompanying drawings.

A representative one of inventions disclosed in the present application will be briefly summarized as follows.

Specifically, a polar loop based radio telecommunication apparatus of the present invention has a phase control loop for controlling the phase of a carrier outputted from an oscillator for transmitter, and an amplitude control loop for controlling the amplitude of a transmission output signal outputted from a power amplifier circuit, wherein the apparatus includes precharge means on a forward path from an amplitude detection circuit to the power amplifier circuit, forming the amplitude control loop, for rapidly increasing a control voltage for the power amplifier circuit to a power threshold upon starting transmission. In this way, the amplitude loop operates in an open loop way during precharge, thus ensuring that the output power of the power amplifier circuit can be increased to a power threshold within a prescribed time upon starting transmission.

DESCRIPTION OF THE INVENTION

Figure 1:
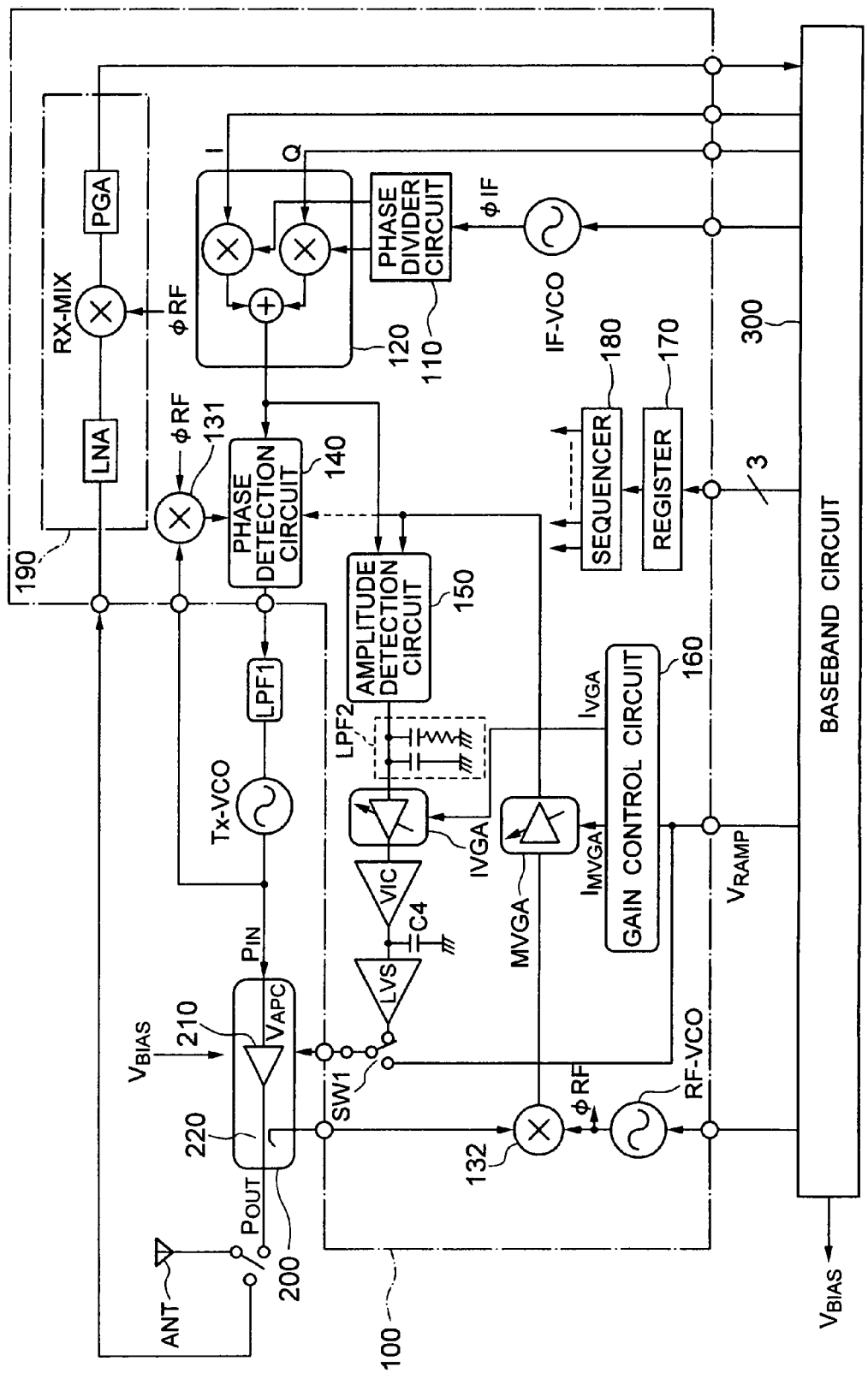
FIG. 1 is a block diagram illustrating the general configuration of a polar loop based transmitter circuit according to a first embodiment of the present invention, and an exemplary configuration of a radio communication system using the same.

FIG. 1 illustrates the general configuration a polar loop based radio telecommunication apparatus according one embodiment of the present invention. In FIG. 1, the polar loop based radio telecommunication apparatus comprises a high frequency IC 100 which is capable of performing the GMSK modulation in a GSM system, and the 8-PSK modulation in an EDGE system; a power module 200 which includes a high frequency power amplifier circuit (hereinafter called the power amplifier) 210 for driving an antenna ANT for transmission, a coupler 220 for detecting transmission power, and the like; a baseband circuit 300 for generating I/Q signals based on transmission data (baseband signal), and generating a control signal for the high frequency IC 100 and a bias voltage VBIAS for the power amplifier 210 in the power module 200; an oscillator for transmitter TxVCO for generating a phase modulated transmission signal (carrier); and a loop filter LPF1 for limiting the bandwidth of a phase loop.

The high frequency IC 100 is implemented as a semiconductor integrated circuit on a single semiconductor chip. The chip of the high frequency IC 100 is formed thereon with a reception-related circuit 190 comprising a low noise amplifier (LNA); a mixer (Rx-MIX) for directly downconverting a received signal to a baseband signal; a high gain programmable gain amplifier (PGA); and the like, in addition to transmission-related circuits, as described below in detail. The high frequency IC 100, oscillator for transmitter TxVCO, loop filter LPF, and the like may be mounted on a single insulating substrate such as a ceramic substrate to form a module.

The foregoing high frequency IC 100 of the embodiment, which constitutes a polar loop, comprises a phase divider circuit 110 for generating a signal, the phase of which is shifted by 90° from an oscillating signal φIF at an intermediate frequency generated by an oscillator IF-VCO; a quadrature modulation circuit 120 for mixing I/Q signals supplied from the baseband LSI 300 with the signal divided by the phase divider circuit 110 for quadrature modulation; a mixer 131 for mixing a feedback signal from the oscillator for transmitter TxVCO with an oscillating signal φRF from a high frequency oscillator RF-VCO for downconversion to a signal such as 80 MHz; a phase detection circuit 140 for detecting a difference in phase between an output signal of the mixer 131 and an output signal of the quadrature modulation circuit 120; a mixer 132 for mixing a detection signal from the coupler 220 for detecting an output level of the power amplifier 210 with the oscillating signal φRF from a high frequency oscillator RF-VCO; a feedback variable gain amplifier circuit MVGA for amplifying an output of the mixer 132; an amplitude detection circuit 150 for comparing the amplified signal with the output signal of the quadrature modulation circuit 120 to detect an amplitude difference; a loop filter LPF2 for generating a voltage in accordance with an output of the amplitude detection circuit 150 and for limiting a frequency bandwidth of an amplitude loop; a forward variable gain amplifier circuit IVGA for amplifying an output of the loop filter LFP2; a gain control circuit 160 for controlling the gains of the variable gain amplifier circuit MVGA and IVGA; a register 170 for setting control information, operation mode and the like within the chip; a sequencer 180 for outputting a timing signal for each of the circuits within the chip based on values set in the register 170 to operate the circuit in a predetermined order in accordance with an operation mode; and the like. After IVGA, there are a VIC (voltage to current controller), a capacitor C4 and a level shifter LVS, followed by the switch SW1.

In this embodiment, an amplitude loop is formed by the coupler 220-mixer 132-variable gain amplifier circuit MVGA-amplitude detection circuit 150-loop filter LPF2-variable gain amplifier circuit IVGA-power amplifier 210. Also, a phase loop is formed by the phase detection circuit 140-loop filter LPF1-oscillator for transmitter TxVCO-mixer 131-phase detection circuit 140. Specifically, if there is a phase difference between an output signal of the quadrature modulation circuit 120 and a feedback signal from the mixer 131, a voltage for reducing the phase difference is supplied to a frequency control terminal of the oscillator for transmitter TxVCO, such that the phase of the feedback signal from the mixer 131 matches the phase of the output signal of the quadrature modulation circuit 120. This phase loop performs such a control that prevents the phase of the output of the oscillator for transmitter TxVCO from shifting due to fluctuations in power supply voltage and a change in temperature. The oscillator for transmitter TxVCO has a constant amplitude.

Further, in this embodiment, the output of the variable gain amplifier circuit MVGA is fed back to the phase detection circuit 140 such that a path comprised of the coupler 220-mixer 132-variable gain amplifier circuit MVGA can be used as a common feedback path for the amplitude loop and phase loop.

In the amplitude loop, the output of the power amplifier 210 is detected by the coupler 220, the detection signal of which is converted to an intermediate frequency bandwidth (IF) by the mixer 132, and amplified by the variable gain amplifier circuit MVGA to generate a feedback signal SFB which is supplied to the amplitude detection circuit 150. Then, the amplitude detection circuit 150 compares a transmission signal modulated by the quadrature modulation circuit 120 with the feedback signal SFB to detect an amplitude difference which is then amplified by the variable gain amplifier circuit MVGA, and applied to an output control terminal of the power amplifier 210 as a control voltage VAPC for performing an amplitude control.

In this embodiment, the gains of the variable gain amplifier circuits MVGA, IVGA are controlled by the gain control circuit 160 in a reverse direction in accordance with a control voltage VRAMP from the baseband LSI 300 such that the sum of their gains is substantially constant. This control is performed by the following reason. As the open loop gain must be kept constant for maintaining a constant frequency bandwidth for the amplitude loop, when the amplitude loop is used to control the output power of the power amplifier 210, a change in the gain of the variable gain amplifier circuit MVGA on the feedback path causes a change in the gain in the amplitude loop, resulting in a reduced bandwidth, a reduced phase margin and a lower stability of the loop.

In this embodiment, for controlling the output power of the power amplifier 210, when the gain of the variable gain amplifier circuit MVGA on the feedback path is increased, the gain of the variable gain amplifier circuit IVGA on the forward path is reduced on the contrary, and when the gain of the variable gain amplifier circuit MVGA on the feedback path is reduced, the gain of the variable gain amplifier circuit IVGA on the forward path is increased on the contrary. In this way, the open loop gain can be kept constant, so that the frequency bandwidth for the amplitude loop is kept constant as well.

Now, detailed description will be made on a gain control for the variable gain amplifier circuit IVGA on the forward path and the variable gain amplifier circuit MVGA on the feedback path.

A portable telephone terminal which supports EDGE or GSM controls a power amplifier to increase or reduce the output power POUT to a desired value within a fixed time. In a polar loop, this power control is performed by controlling the gain of the variable gain amplifier circuit MVGA. Specifically, since a reduction in the gain of the variable gain amplifier circuit MVGA results in a smaller feedback signal in the amplitude loop, the amplitude loop reacts by increasing the RF gain GPA (POUT/PIN) of the power amplifier, in order to match the feedback signal with a reference signal SREF from the modulation circuit 120, and consequently this reaction increases the output power POUT. For reducing the output power POUT, the gain of the variable gain amplifier circuit MVGA may be increased. In this embodiment, the gain of the variable gain amplifier circuit MVGA is controlled by the control voltage VRAMP from the baseband LSI 300. Moreover, the proportion of a reduction or an increase in the gain GMVGA of the variable gain amplifier circuit MVGA is always equal to the proportion of an increase or a reduction in the RF gain GPA of the power amplifier.

Figure 12A:
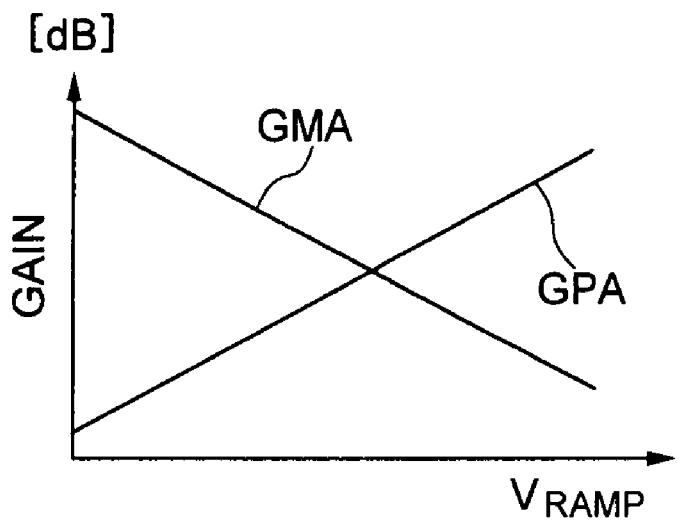
FIGS. 12A and 12B are graphs showing a relationship among an output control voltage VRAMP and the gains of an output power amplifier and a variable gain amplifier circuit, and a relationship between the output control voltage VRAMP and the output power of the output power amplifier in the polar loop based transmitter circuit according to another embodiment of the present invention.
Figure 12B:
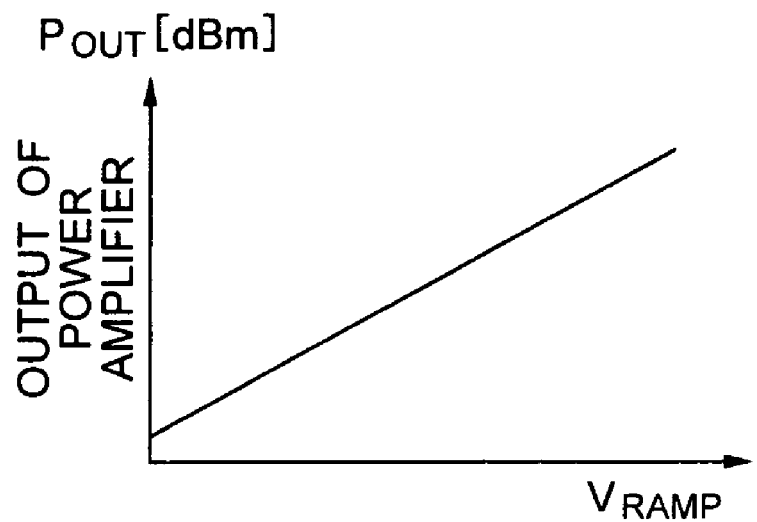

For this control strategy, a change in the gain of the variable gain amplifier circuit MVGA in response to the control voltage VRAMP exhibits a straight line descending to the right, as indicated by a solid line GMA in FIG. 12A, while a change in the gain of the power amplifier 210 in response to the control voltage VRAMP exhibits a straight line ascending to the right, as indicated by a solid line GPA in FIG. 12A. Also, this causes the output power POUT of the power amplifier 210 to linearly increase in response to the control voltage VRAMP, as shown in FIG. 12B. The output power POUT of the power amplifier 210 expressed in dBm linearly increases with the VRAMP expressed in volts.

On the other hand, the reference signal SREF from the modulation circuit 120, which is modulated in conformity to 8-PSK and has a varying amplitude component, is controlled by the action of the amplitude control loop such that an amplitude component of the output power POUT of the power amplifier 210 matches the reference signal SREF. In this event, the output power POUT of the power amplifier 210 is modulated at a desired value by the aforementioned power control. In this way, the polar loop can modulate the output power of the power amplifier in conformity with 8-PSK. In addition, since the polar loop can simultaneously support GMSK as well, an operated output power control function (APC function), which has been conventionally provided by an externally attached IC, is not required anymore.

In addition to the foregoing, this embodiment is configured such that the power amplifier 210 can be selectively supplied, at its output control terminal, with an output voltage of the variable gain amplifier circuit IVGA or the control voltage VRAMP from the baseband LSI 300 through a switch SW1. Specifically, the high frequency power amplifier circuit 210 is controlled by a control voltage from the amplitude loop in an 8-PSK modulation mode, while in a GMSK modulation mode, the power amplifier 210 is directly supplied with the control voltage VRAMP from the baseband LSI 300, instead of the control voltage from the amplitude loop, such that the output of the power amplifier 210 can be controlled. The embodiment also allows the amplitude loop to control the power amplifier when operating in GMSK mode. The switch SW1 can be switched by setting the register 170 from the baseband LSI 300.

As described above, since the polar loop can correctly control the phase and amplitude of the output of the power amplifier 210 by a common action of the phase loop and amplitude loop, this is suitable for a dual mode transmitter circuit which supports both GMSK and EDGE modulation schemes. This is because GMSK modulation scheme provides transmission information only in a phase component, whereas the EDGE scheme additionally provides information in an amplitude component for increasing the data rate. Thus, a transmitter circuit which supports only the GMSK scheme conventionally performs such a control that provides only a constant amplitude at the output of the power amplifier, so that the conventional transmitter circuit cannot support a scheme such as EDGE which involves a varying amplitude. Since the polar loop compares the feedback signal from the output of the power amplifier 210 with the output of the modulation circuit 120, the output of the power amplifier 210 (precisely, average output power of the power amplifier) can be controlled by varying the gain of the variable gain amplifier circuit as previously described. This is used during power ramping only.

During power ramping, the reference signal is always of constant amplitude. The only way to increase the output power of the power amplifier is to reduce the gain of the variable gain amplifier MVGA to control power ramping.

During the useful part of the burst, the variable gain amplifier gain is maintained constant, so that the output power of the power amplifier perfectly replicates the amplitude modulation of the reference signal. So, when the GSMK mode is used, the output power remains constant and, when the EDGE mode is used, the output power varies like as 8-PSK signal.

In either of the GSM and EDGE schemes, however, the standard prescribes that the power in a rising (build-up) period, a falling (build-down) period, and a data transmission period must always fall within a predetermined time mask at an antenna end, but it is relatively difficult to implement a circuit which satisfies the standard particularly in respect to the rising period. In the following, an embodiment which can satisfy the standard in this respect will be described in greater detail.

Figure 2:
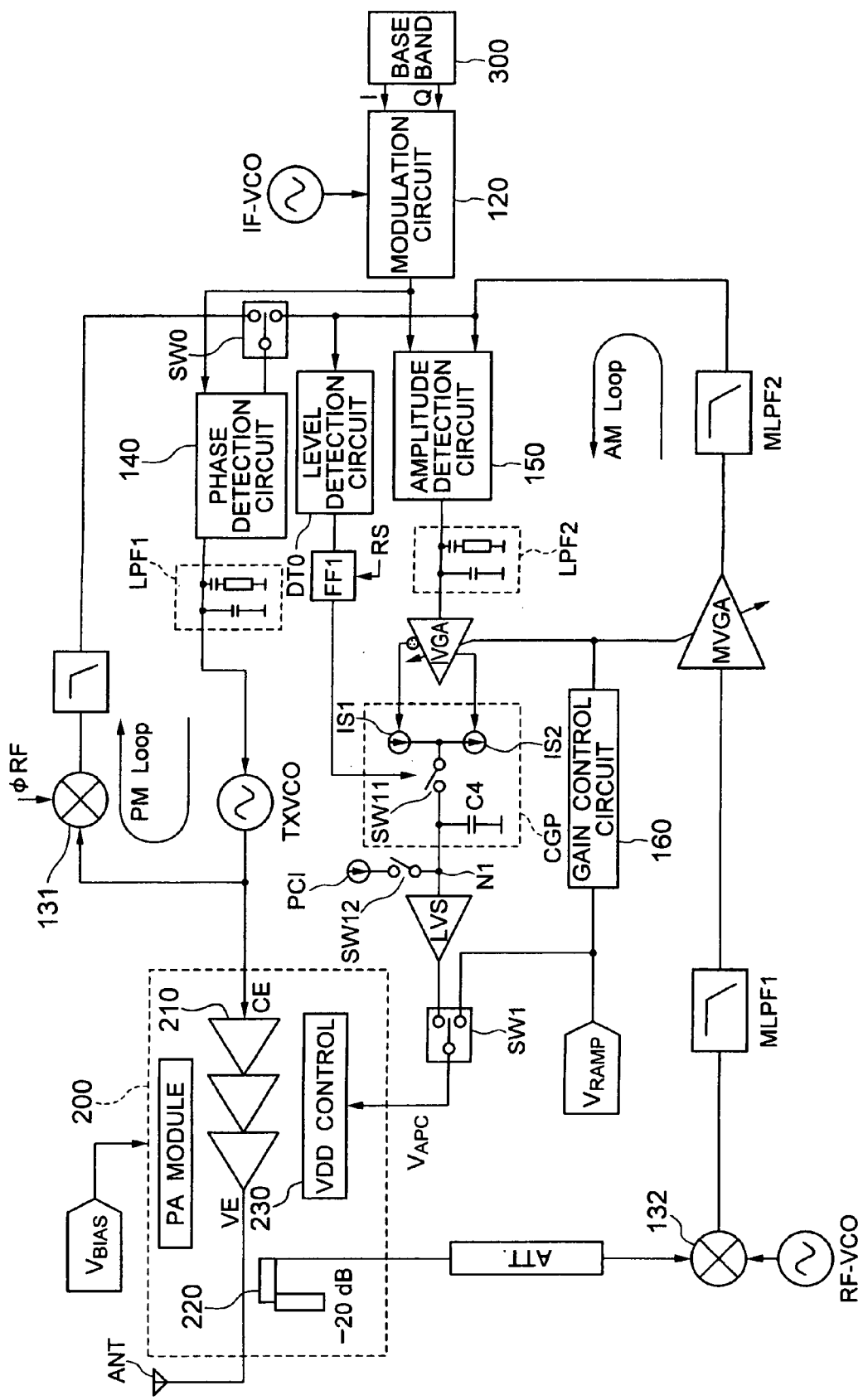
FIG. 2 is a block diagram illustrating an exemplary configuration of a polar loop in the transmitter circuit of FIG. 1 in greater detail.

FIG. 2 illustrates the configuration of the phase loop and amplitude loop in greater detail. As illustrated in FIG. 2, an attenuator ATT is provided between the coupler 220 and mixer 132 for attenuating the output of the coupler 220 and supplying the attenuated output to the mixer 132, and low pass filters MLPF1, MLPF2 are provided between the mixer 132 and variable gain amplifier circuit MVGA and between the variable gain amplifier circuit MVGA and amplitude detection circuit 150, respectively, for removing unwanted harmonics. Also, in this embodiment, a switch SW0 is provided for selectively inputting the output level of the power amplifier 210 detected by the coupler 220 and fed back through the feedback path to the phase detection circuit 140 or amplitude detection circuit 150.

Further, in this embodiment, provided behind the variable gain amplifier circuit IVGA are a charge pump CGP for charging or discharging depending on a differential output of the variable gain amplifier circuit IVGA to generate a voltage in accordance with the output of the variable gain amplifier circuit IVGA, and a level shift circuit LVS for shifting the voltage generated by the charge pump CGP by approximately 0.6 V in the negative direction. Additionally, the LVS can be designed to produce the same gain. The charge pump CGP is comprised of a pair of current sources IS1, IS2, and a capacitor C4, and a switch SW11 is provided between the current sources IS1, IS2 and the capacitor C4 for shutting down the loop.

An output node N1 of the charge pump CGP is connected to a precharge current source PCI for precharging this node through a switch SW12. Further provided in this embodiment are a level detection circuit DCT for comparing a signal from the modulation circuit 120 with a feedback signal of the amplitude loop to detect whether or not the feedback signal reaches a predetermined level, and a flip-flop FF1 operated by an output signal of the level detection circuit DCT to generate an ON/OFF control signal for the switches SW11, SW12. The level detection circuit DCT is configured such that its output signal changes to high level when the feedback signal reaches −5.9 dBm. The feedback signal at −5.9 dBm corresponds to the level of the feedback signal when the output control terminal (VAPC) of the power module 200 is at a level such as −11 dBm. The shift level circuit LVS is provided because the charge pump CGP is not capable of providing 0 V due to the nature of the current source IS2.

Figure 3:
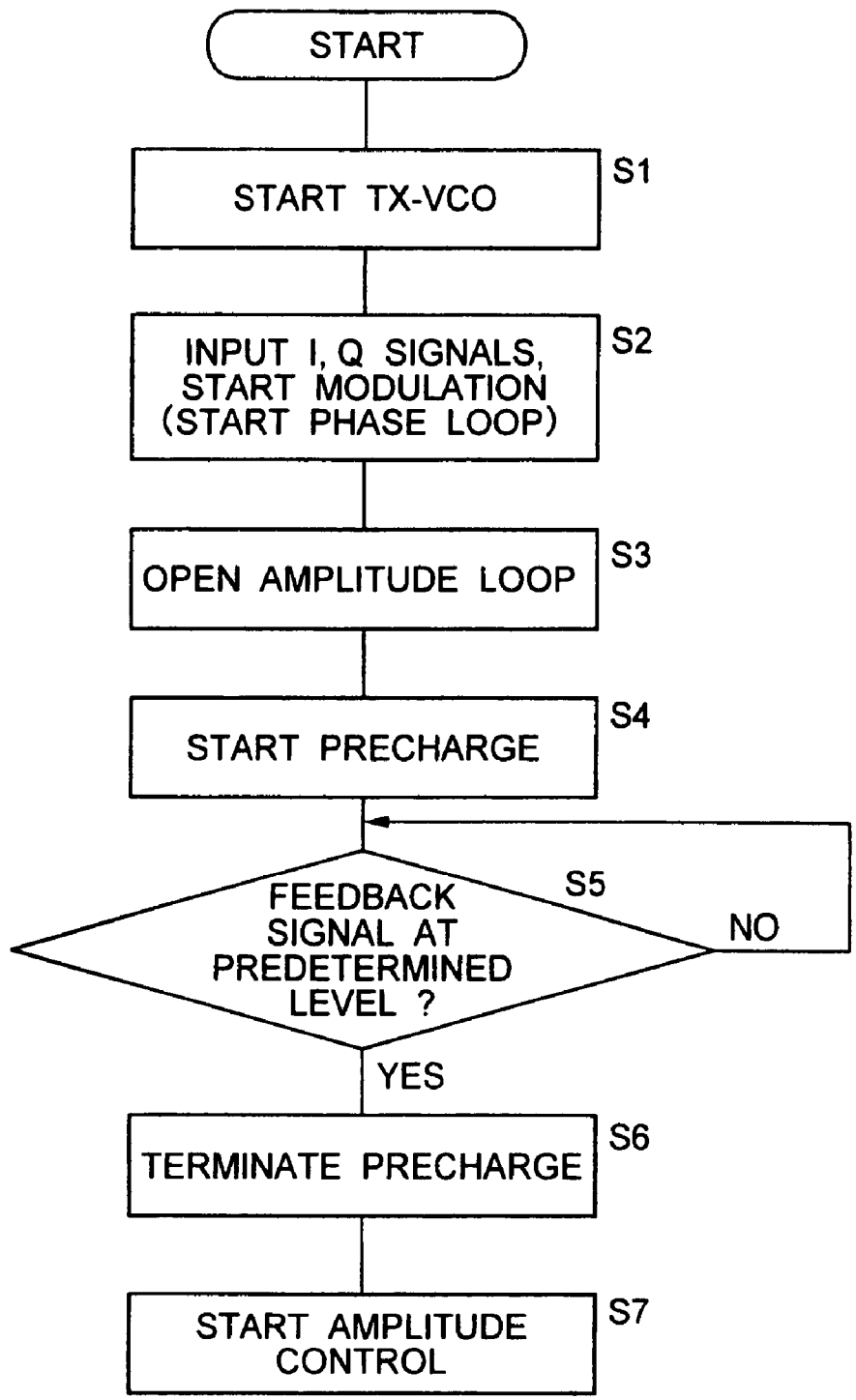
FIG. 3 is a flow chart illustrating a control procedure in the polar loop based transmitter circuit according to the first embodiment of the present invention upon building up output power.

Next, the operation involved in building up the output power in the polar loop based transmitter circuit according to this embodiment will be described with reference to a flow chart of FIG. 3.

In the output power build-up operation, the oscillator for transmitter TxVCO is first turned on (step S1). Subsequently, I, Q signals are sent from the baseband LSI 300 to the modulation circuit 120 to modulate an intermediate frequency signal φIF and supplies the modulated signal to the phase detection circuit 140 and amplitude detection circuit 150. In this event, the phase detection circuit 140 is fed back with a transmission signal of the oscillator for transmitter TxVCO after downconverted by the mixer 131. The phase detection circuit 140 compares the phase of the feedback signal with that of the modulated signal to start such a control that matches the phases of the two signals with each other (step S2). The amplitude detection circuit 150 is also applied with the modulated signal and a detection signal from the coupler 220 through the feedback path.

Figure 9:
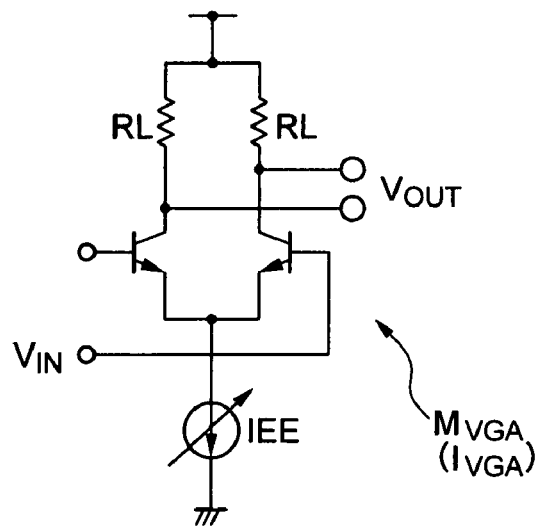
FIG. 9 is a circuit diagram illustrating an exemplary specific circuit configuration of a variable gain amplifier circuit.
Figure 10:
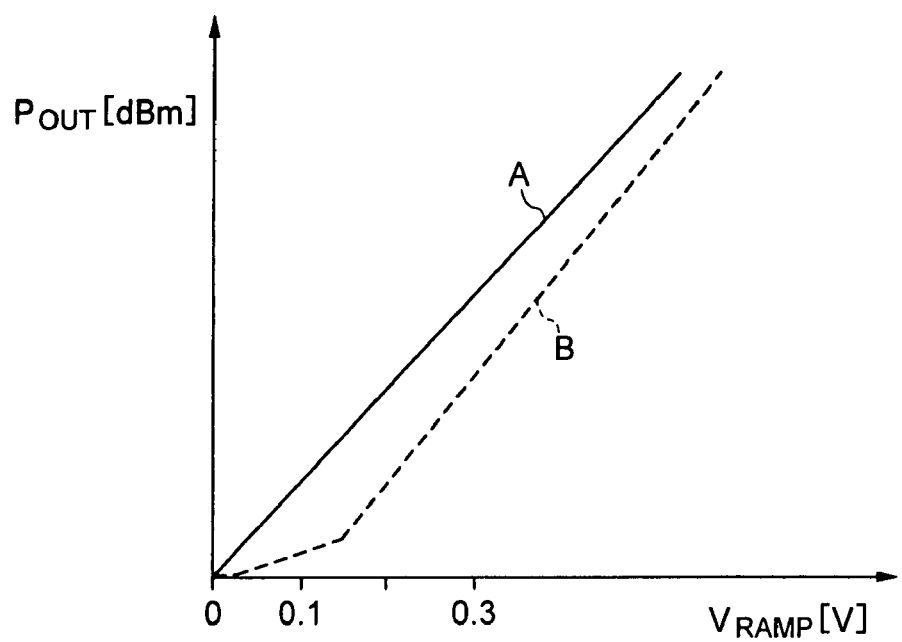
FIG. 10 is a characteristic diagram showing a relationship between the output power and output control voltage of an output power amplifier that forms part of a radio communication system which uses the polar loop based transmitter circuit according to another embodiment of the present invention.
Figure 11:
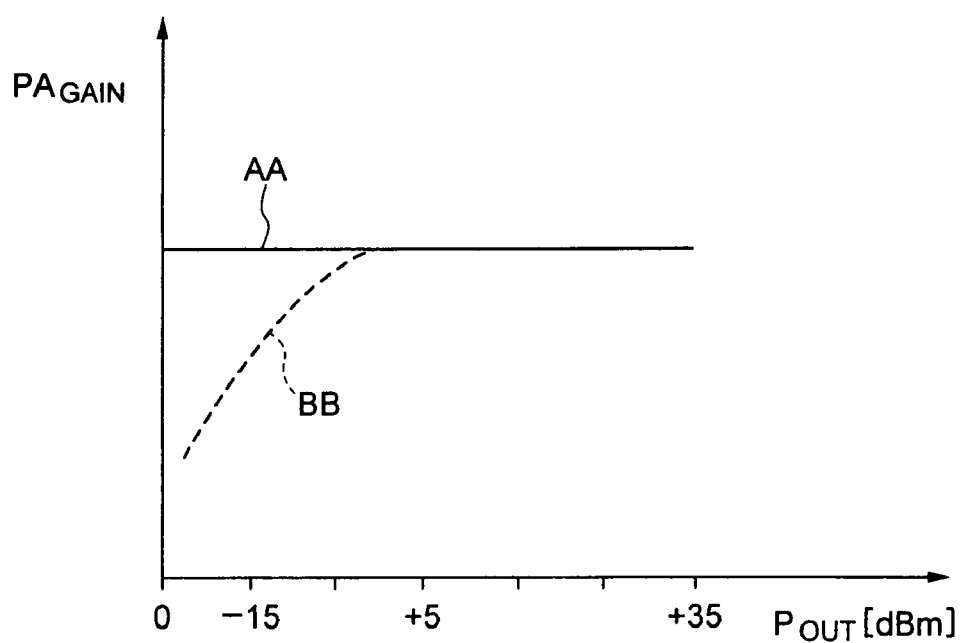
FIG. 11 is a characteristic diagram showing a relationship between the output power and power gain of the output power amplifier that forms part of the radio communication system which uses the polar loop based transmitter circuit according to another embodiment of the present invention.

Next, the flip-flop FF1 is reset by a reset signal RS, and the switch SW11 on the forward path of the amplitude loop is turned off by the output signal of the flip-flop FF1 to open the loop (step S3). In this event, when the variable gain amplifier circuit IVGA is implemented by a general differential amplifier circuit as illustrated in FIG. 9, the variable gain amplifier circuit IVGA is short-circuited between an inverting input terminal and a non-inverting input terminal. This is done in order to maintain a reference voltage for capacitors C2, C3 and a resistor R3 within the loop filter LPF2 on the amplitude loop and to avoid sudden fluctuations in the output of the variable gain amplifier circuit IVGA when the amplitude loop is closed.

Also, substantially simultaneously with the loop being opened, the switch SW12 is turned on to start precharging the capacitor C4 of the charge pump CGP by the precharge current source PCI (step S4). Subsequently, as the level detection circuit DCT determines that the modulated signal matches in level with the feedback signal from the amplitude loop, the level detection circuit DCT operates the flip-flop FF1 as a latch to change its output (steps S5, S6). This causes the switch SW12 to turn off to stop precharging, and the switch SW11 on the forward path to turn on to close the amplitude loop, thereby starting the amplitude control (step S7). Also, at this time, the variable gain amplifier circuit IVGA releases the differential input terminals from the short-circuited state.

The foregoing operation is automatically executed by a sequencer 180 by sending a transmission starting command from the baseband LSI 300 to the high frequency IC 100. Then, the output control voltage VRAMP is already active before the switch SW11 is turned on to close the amplitude loop to control the power module 200 to build up its output power to a desired level.

Figure 4:
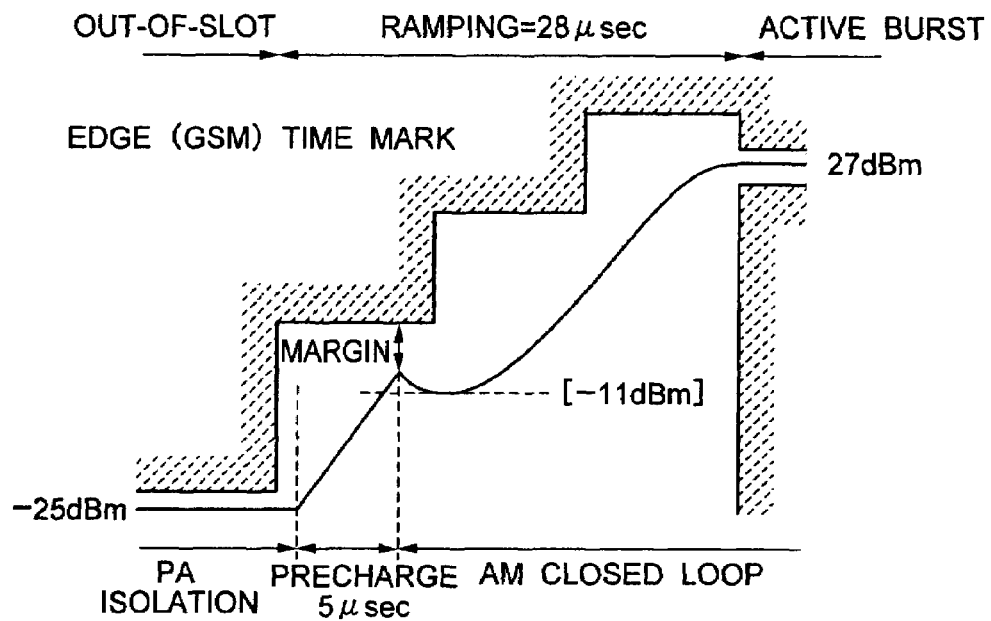
FIG. 4 is an explanatory diagram showing a relationship between a change in output level upon building up the output power from the polar loop based transmitter circuit according to the first embodiment of the present invention and a time mask when a required output level, prescribed in the GSM system standard, is low.
Figure 5:
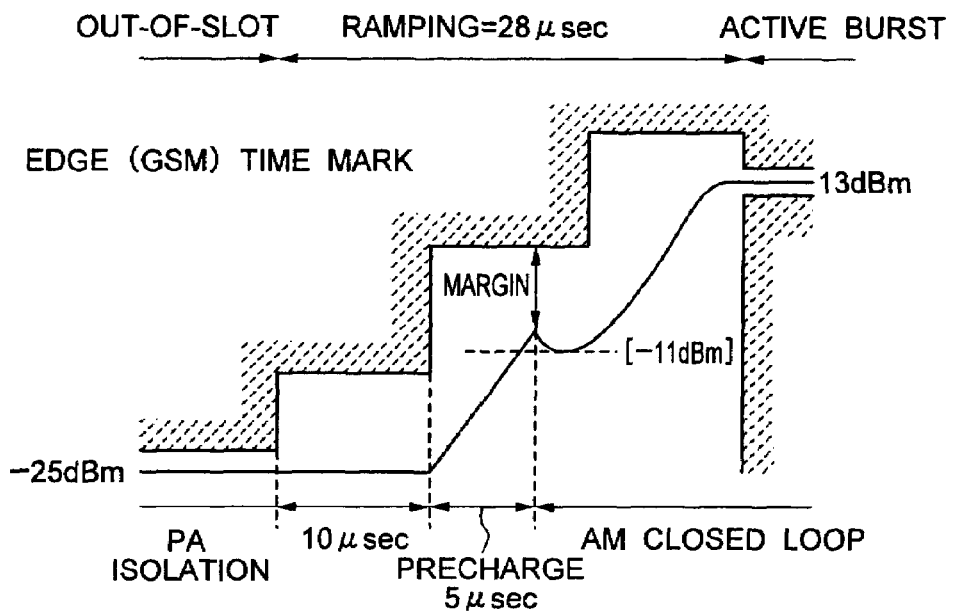
FIG. 5 is an explanatory diagram showing a relationship between a change in output level upon building up the output power from the polar loop based transmitter circuit of the present invention and a time mask when a required output level, prescribed in the GSM system standard, is high.

As described above, in this embodiment, as soon as the capacitor C4 in the amplitude loop is precharged, the output power can be ramped up in the required time condition, as shown in FIG. 4, thereby making it possible to build up the output power within a time mask prescribed in the EDGE scheme (the same applies to the GMSK scheme). FIG. 4 shows a time mask and an associated build-up operation when a required output level is relatively high such as 27 dBm at a location relatively far from a base station, while FIG. 5 shows a time mask and an associated build-up operation when a required output level is relatively high such as 13 dBm at a location relatively far from a base station. When the required output level is relatively low, the output power can be built up within the prescribed time mask by delaying the start of precharge by a predetermined time, for example, 10 μsec, as shown in FIG. 5.

Figure 6:
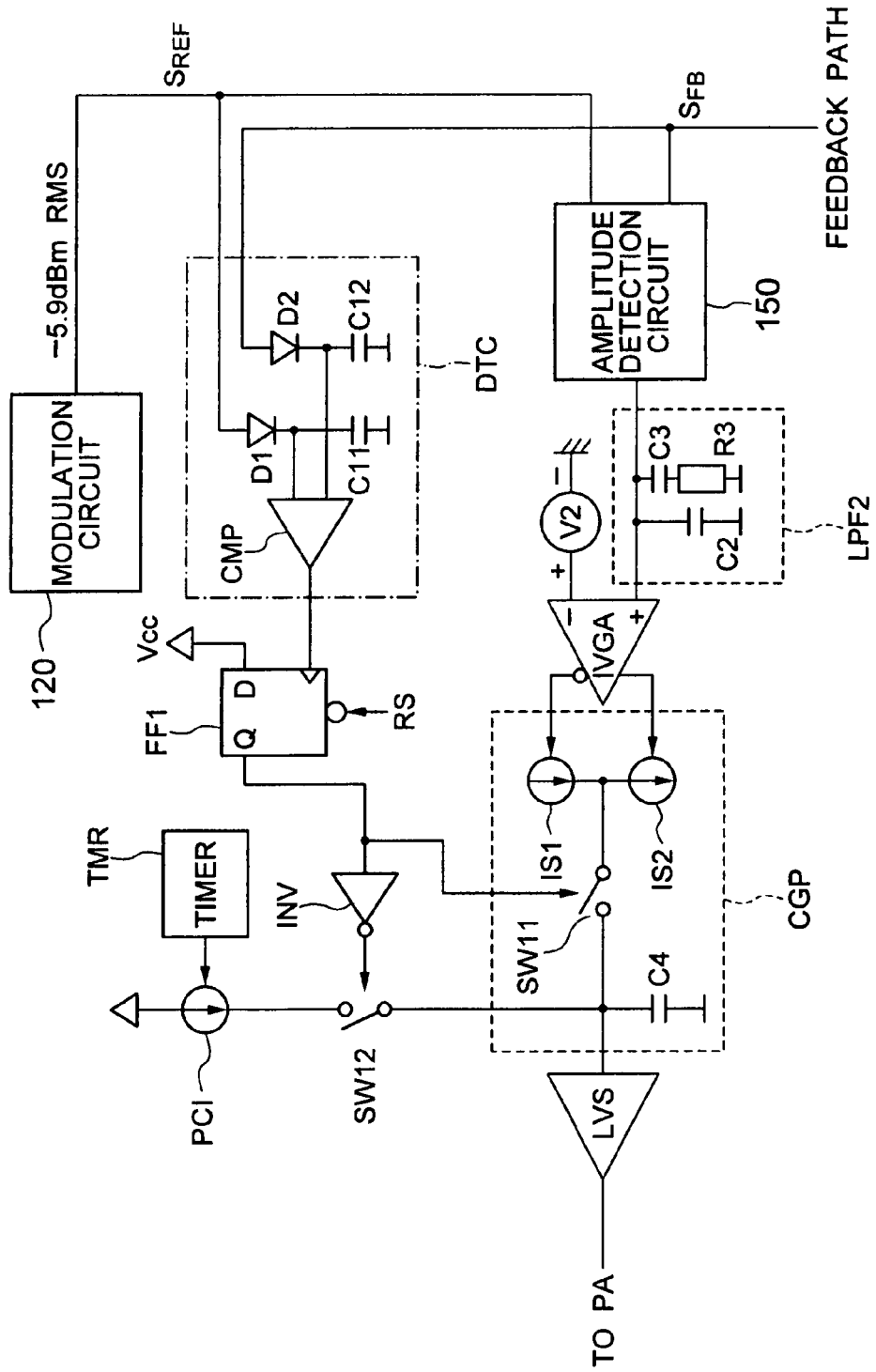
FIG. 6 is a schematic circuit diagram illustrating an exemplary configuration of a forward path of an amplitude control loop in detail, showing a second embodiment of the present invention.

FIG. 6 illustrates a second embodiment of a precharge circuit.

The precharge circuit in the second embodiment comprises a timer TMR for controlling the precharge current source PCI in addition to the like circuit in the first embodiment. The timer TMR can be configured to measure the time in response to a clock signal supplied from the baseband LSI 300. Also, the timer TMR may be provided integrally with other timers within the sequencer 180. The timer TMR is started simultaneously with the start of precharge at step S4 in FIG. 3, and the precharge current source PCI is turned off, for example, after the lapse of 5 μsec. In this way, the precharge can be terminated even if no change is found in the output of the level detection circuit DTC because the feedback signal has not reached the predetermined level at that time.

Even if constants of elements constituting the precharge circuit are set by design such that the output of the level shift circuit LVS, i.e., the output control voltage (VAPC) of the power module 200 reaches a level such as −11 dB in about 5 μsec after the start of precharge, variations due to manufacturing may cause a build-up rate of the output power to be lower than expectancy. Therefore, if the precharge takes a long time, a time significantly longer than 5 μsec, the output power of the power module 200 cannot be build up to a power threshold within a predetermined time (28 μsec) defined by the time mask. The second embodiment solves this problem.

In the embodiment of FIG. 6, the precharge current source PCI is controlled to be on and off by the timer TMR. Alternatively, an AND gate may be provided for taking logical AND of the output of the flip-flop FF1 (invertor INV in FIG. 6) and the output of the timer TMR, such that the switch SW12 is turned off by the earlier one of these outputs to terminate the precharge. However, it is preferable from a viewpoint of timing to control on and off the precharge current source PCI using the timer TMR and to turn off the switch SW12 using the output of the flip-flop FF1 (invertor INV), as is the case with the embodiment of FIG. 6.

More specifically, a regulated current source generally presents a slower reaction than the switch SW12, so that if the precharge were terminated by turning off the precharge current source PCI using the output of the flip-flop FF1 when the level detection circuit DTC presents a change in the output, the output power could fall within a prohibited range of the time mask due to a delay in the reaction of the current source PCI when variations due to manufacturing cause the output power to be much higher than expected. Thus, the switch SW12 is preferably turned off using the output of the flip-flop FF1 (invertor INV) as is done in the foregoing embodiment.

On the other hand, considering that variations due to manufacturing cause the build-up rate of the output power to be lower than expected, when the precharge current source PCI is turned off using the timer TMR in such a case, as is done in the foregoing embodiment, the output power reached at the end of the precharge period is higher than the output power that the amplitude loop would reach by itself due to a delayed reaction of the precharge current source PCI. For this reason, the embodiment configured as such is advantageous in its ability to advance, even slightly, the build-up of the output power.

Figure 7:
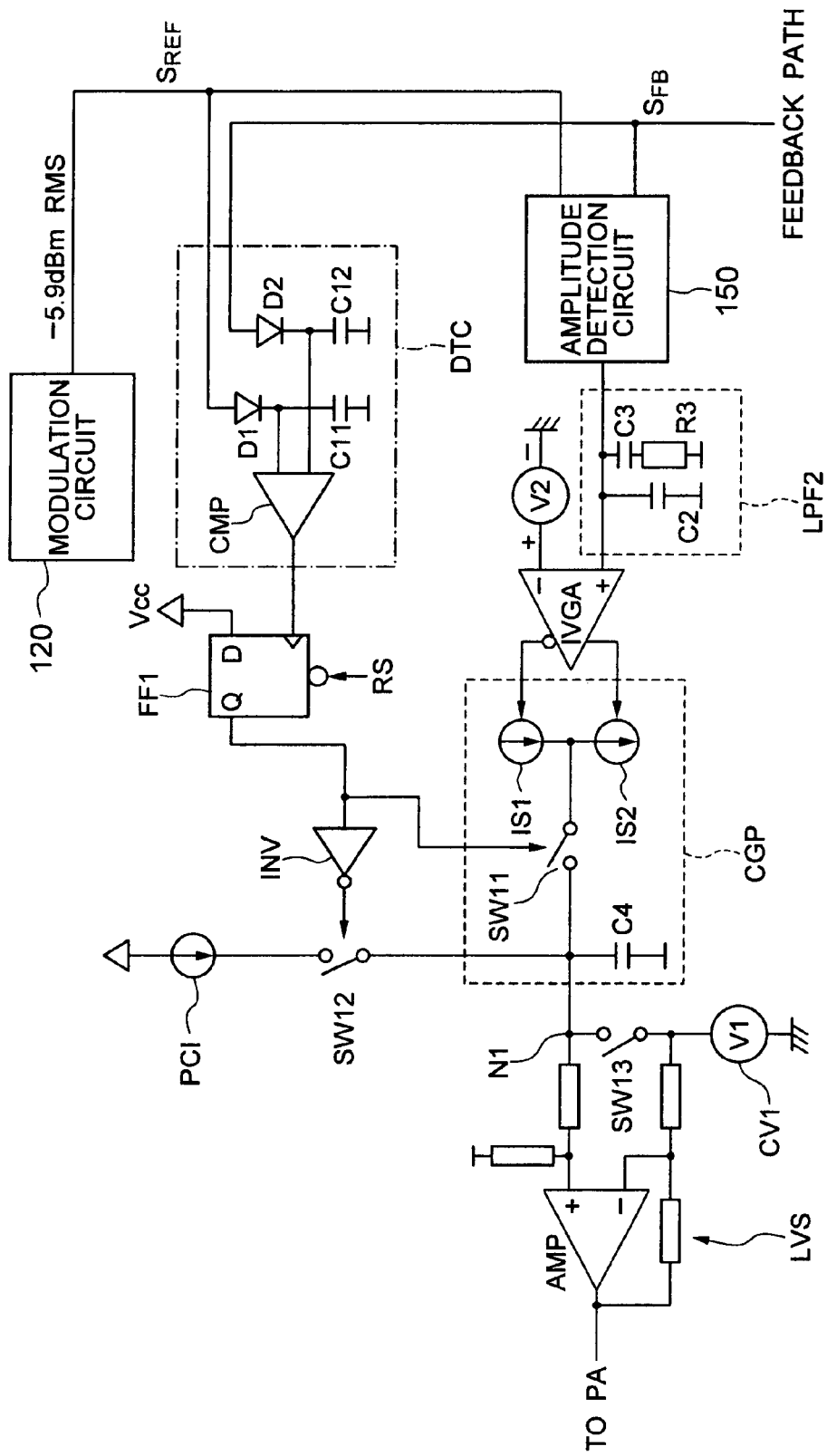
FIG. 7 is a schematic circuit diagram illustrating an exemplary configuration of a forward path of an amplitude control loop in detail, showing a third embodiment of the present invention.

The embodiments in FIG. 6 and next FIG. 7 show exemplary configurations of the level detection circuit DTC. The level detection circuit DTC in these embodiments comprises a first AC-DC converting means comprised of a diode D1 and a capacitor C11 for converting a signal (for example, an AC signal at 80 MHz) SREF supplied from the modulation circuit 120 for defining a reference level of −5.9 dBm to a DC signal; a second AC-DC converting means comprised of a diode D2 and a capacitor C12 for converting a feedback signal SFB from the feedback path of the amplitude loop to a DC signal; and a comparator CMP comprised of a differential amplifier for comparing the converted signals with each other.

FIG. 7 illustrates a third embodiment of the precharge circuit.

Figure 8:
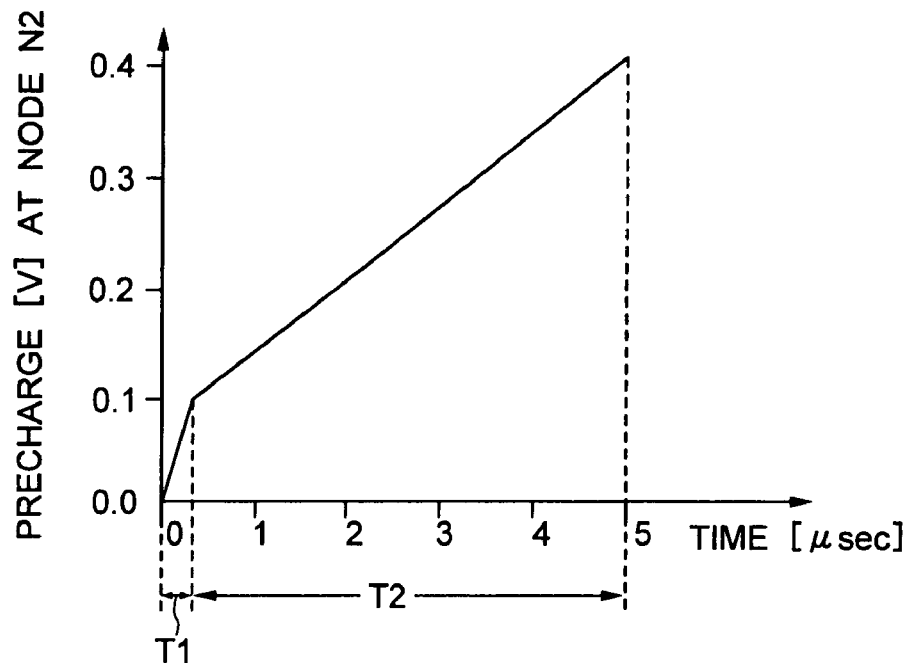
FIG. 8 is a graph showing a level change in the forward path of the amplitude control loop upon building up the output power in the third embodiment.

The third embodiment applies a two-stage precharge method for precharging in stages the capacitor C4 which forms part of the charge pump CGP. Specifically, a switch SW13 is provided between a regulated voltage source CV1 (0.1 V) which provides a voltage as a reference for a shift amount (−0.6 V on the output side) in the level shift circuit LVS, and the node N1 to which the capacitor C4 is connected, such that the regulated voltage source CV1 can be utilized as a precharge power supply. In addition, the precharge current source PCI used herein supplies a smaller current value than the precharge current sources PCI in the first and second embodiments. Then, in the third embodiment, as illustrated in FIG. 8, the switch SW13 is first turned on within a short time T1 immediately after the output power is build up to precharge the capacitor C4 to 0.1 V by the regulated voltage source CV1. Subsequently, the switch SW12 is turned on to slowly precharge the capacitor C4 to approximately 0.4 V by the precharge current source PCI over a relatively long time T2.

In the foregoing embodiment, the switch SW12 for precharge control is turned off using the output of the level detection circuit DCT in order to prevent a delay in timing at which the precharge is terminated. Considering more strictly, there is a detection delay in the level detection circuit DCT which detects that the output power of the power module 200 reaches −11 dBm, and a delay in the timing at which the switch SW12 is turned off using the output of the level detection circuit DCT indicative of the detection, so that the capacitor C4 is likely to be excessively precharged in the meantime. Therefore, the third embodiment employs the precharge current source PCI which supplies a relatively small current value to reduce the precharge rate. In addition, before the capacitor C4 is precharged by the precharge current source PCI, the capacitor C4 is relatively rapidly precharged up to 0.6 V so that the LVS output reaches 0.1 V, utilizing the regulated voltage source CV1 for shifting, and then is slowly precharged by the precharge current source PCI. In this way, the capacitor C4 can be prevented from the excessive precharge.

During the precharge, the variable gain amplifier circuit IVGA is short-circuited between the inverting input terminal and non-inverting input terminal, and its output is opened (by SW11 in FIG. 7). Then, simultaneously with the termination of the precharge, the two input terminals are active, while the output is also active.

While the invention made by the present inventors has been specifically described in connection with several embodiments, it should be understood that the present invention is not limited to the aforementioned embodiments but may be modified in various manner without departing from the spirit and scope of the invention. For example, while the third embodiment utilizes the regulated voltage source CV1 for shifting in the level shift circuit LVS for the precharge at the first stage, a separate regulated voltage source may be provided for supplying a voltage lower than a target precharge level (for example, 0.4 V) for the amplitude loop to perform the precharge at the first stage. However, an increase in circuit scale can be prevented by utilizing the regulated voltage source CV1 for shifting as in the third embodiment.

While the present invention has been described in connection with a dual-band system to which the present invention is applied, where the system is configured to provide for communications in accordance with two schemes, i.e., the GSM 900 scheme and DCS1800 scheme, the present invention can be utilized as well for permitting communications which involves phase modulation in accordance with an 8-PSK modulation mode, in addition to a GMSK modulation mode, in a triple-band system which is configured to provide for communications in accordance with either the GSM scheme or DCS scheme, or in accordance with a PCS (Personal Communication System) 1900 scheme in addition to these schemes or communications using 850 MHz.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A radio communication apparatus comprising:
   a base band unit which generates signals to be transmitted;
   a modulator which modulates the signals;
   a phase detector which detects a phase component of the signals modulated by the modulator;
   an amplitude detector which detects an amplitude component of the signal modulated by said modulator;
   an oscillator which generates a transmission signal in accordance with an output of the phase detector;
   a power amplifier which amplifies the transmission signal;
   a feedback path which supplies an output level instruction signal of the power amplifier circuit to the amplitude detector; and
   a forward path which supplies an output of the amplitude detector to the power amplifier for control of an amplitude of the transmission signal;
   wherein the forward path includes a loop filter which generates a voltage in response to the output of the amplitude detector; a first amplifier which amplifies the voltage; a charge pump circuit which includes a capacitor, a current source for charging said capacitor, a current sink for discharging a charge on said capacitor, and which is configured to operate the current source and the current sink in response to an output of the first amplifier to accumulate a charge on the capacitor; and a precharge unit which is arranged between the first amplifier and the power amplifier and which is capable of rapidly increasing a control voltage by charging the capacitor for the power amplifier to a power threshold on starting transmission.

2. A radio communication apparatus according to claim 1, further comprising:
   a level detector which detects the output level instruction signal,
   wherein the precharge unit includes a precharge current source and switch circuit connected in series with the precharge current source,
   wherein the switch circuit is configured to be turned on when the power amplifier starts transmission, and the switch circuit is turned off in accordance with an output of the level detector.

3. A radio communication apparatus according to claim 1, further comprising a timer circuit,
   wherein the precharge operation of the precharge unit is terminated at an earlier one of timing of detection of lapse of a predetermined time measured by the timer circuit after the precharge unit starts the precharge operation, and timing of changing of the output of the level detector.

4. A radio communication apparatus according to claim 3, wherein the precharge current source is turned off when said timer circuit instructs the precharge unit to terminate the precharge operation.

* * * * *